United States Patent [19]

George et al.

[11] Patent Number: 5,504,694
[45] Date of Patent: Apr. 2, 1996

[54] METHOD OF CELL CHARACTERIZATION FOR ENERGY DISSIPATION

[75] Inventors: Binay J. George; Markus G. Wloka; Sean C. Tyler, all of Chandler, Ariz.

[73] Assignee: Motorola, Inc., Schaumburg, Ill.

[21] Appl. No.: 141,368

[22] Filed: Oct. 28, 1993

[51] Int. Cl.$^6$ .................................................. G06F 17/00
[52] U.S. Cl. ..................... 364/514.12; 364/578
[58] Field of Search ............................. 364/514 R, 488, 364/490, 578

[56] References Cited

U.S. PATENT DOCUMENTS

| T935,003 | 6/1975 | Linville et al. | 364/490 |
|---|---|---|---|
| 4,698,760 | 10/1987 | Lembach et al. | 364/490 |
| 4,783,749 | 11/1988 | Duzy et al. | 364/490 |
| 5,349,542 | 9/1994 | Brasen et al. | 364/490 |

OTHER PUBLICATIONS

Motorola Low Power Design Technology, "Entice Automated Characterization System", Semiconductor Systems Design Technology, User's Manual Version 1.1a, Apr. 6, 1993.

Primary Examiner—Ellis B. Ramirez
Attorney, Agent, or Firm—Robert D. Atkins

[57] ABSTRACT

A method executed by a computer simulator measures energy dissipation in a cell having one or more outputs. A first series of simulations is performed with given cell parameters over a simulation period while varying capacitance on a first output of the cell for providing a first range of currents sunk by the cell. A second series of simulations provides a second range of currents by varying capacitance on a second output. The first and second ranges of currents are converted to first and second ranges of energy dissipations. The energy dissipation due to the charging rates is subtracted from energy dissipation due to the switching for providing a model of energy dissipation by the cell itself. A nominal point of the first range of energy dissipation may be subtracted from each point of the second range of energy dissipation for providing an offset range of energy dissipations.

14 Claims, 2 Drawing Sheets

5,504,694

METHOD OF CELL CHARACTERIZATION FOR ENERGY DISSIPATION

BACKGROUND OF THE INVENTION

The present invention relates in general to software engineering and, more particularly, to a computer simulation for measuring energy dissipation in a cell.

A computer simulation is a useful step during the design of an electronic circuit to test the various features and behavior of the circuit before a physical embodiment is built. One circuit simulator is known as ENTICE which automates a previously tedious, difficult and error-prone process of determining circuit parameter reaction to various input stimuli. The circuit may be mathematically modeled in the computer simulator whereby the design parameters may be verified or manipulated to work out the inevitable problems associated with different embodiments before proceeding with the cost and effort of building an actual hardware model. The simulator generates a pre-defined library of models for transistor level characteristics such as timing and propagation delay. When the circuit under simulation includes a large number of transistors and other electrical components, the user may group transistors into functional blocks known as cells. Thus, the designer may work at a higher level with these functional cell blocks.

One important design characteristic is the energy dissipation by the cell under simulation under a variety of operating conditions. Understanding the energy dissipation model of each cell is necessary to plan the overall energy requirements of the design. In the prior art, energy dissipated has been characterized at the transistor level. Transistor level characterization techniques become time consuming and inefficient when the function blocks under simulation contain a substantial number of transistors.

Hence, a need exists for high level modeling of energy dissipation in the cell under simulation especially when the cell includes multiple outputs.

DETAILED DESCRIPTION OF THE PREFERRED EMBODIMENT

Figure 1:
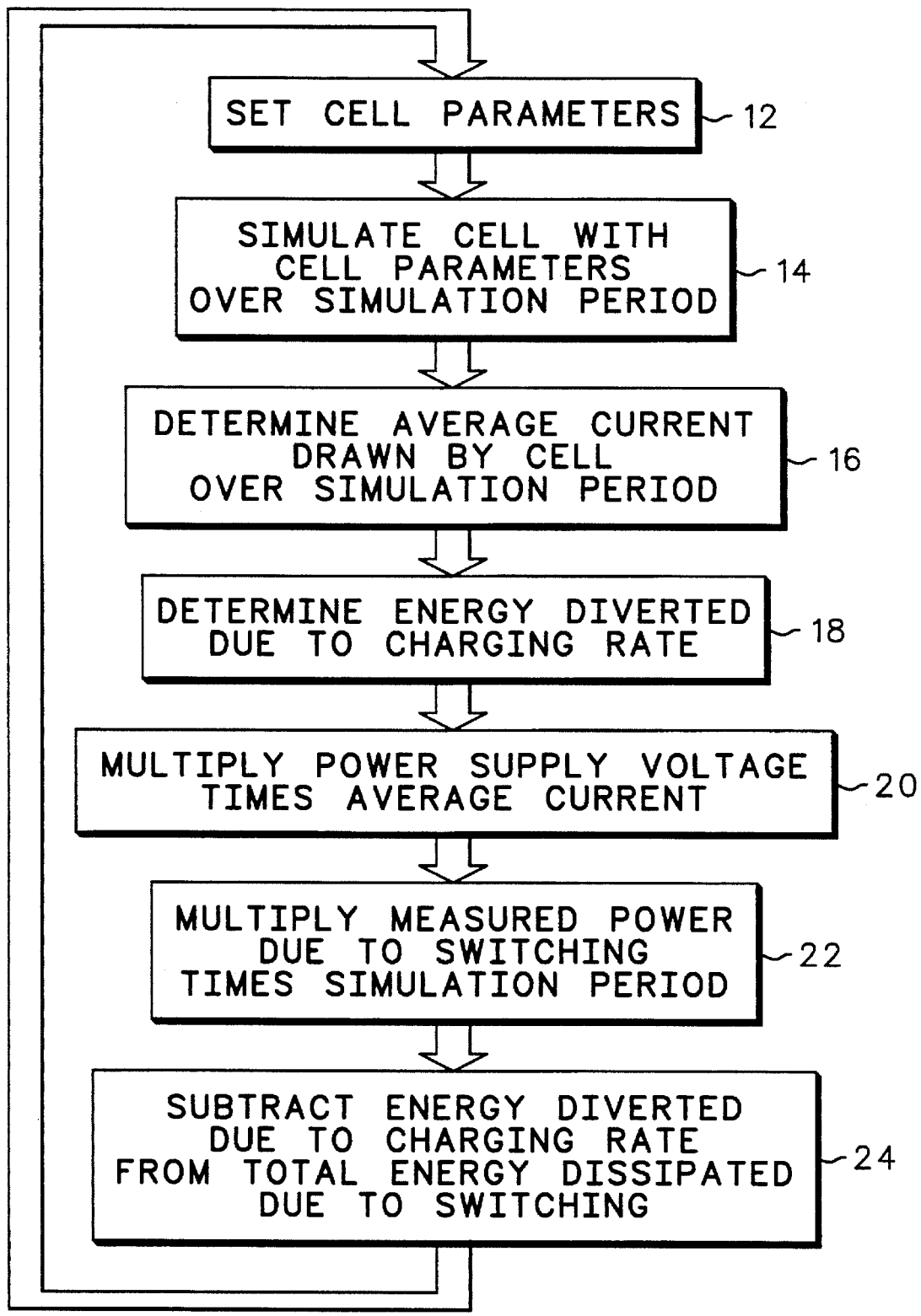
FIG. 1 illustrates a method of measuring energy dissipation by the cell under simulation.

Generally, the present invention allows the user to obtain an energy dissipation model of any generic functional block (cell) comprising transistors and other electrical devices. In particular, the present invention concerns modeling energy dissipation within the cell. The model is obtained by simulating the cell with different input stimuli, e.g. series of input signal vectors, and calculating the energy dissipation within one particular cell. The user may simulate the cell at the "black box" block level in circuit design. The system does not require a different approach to different cells but has a general method applicable to all cells comprising the cell library.

ENTICE is a circuit simulator executed by software on a computer system for characterizing cell behavior to such parameters as timing, propagation delay, energy dissipation, etc. Energy dissipation in a cell has been found to depend on a set of cell parameters such as the rate at which the inputs of the cell switch are either rising or falling, the capacitive loading on the outputs of the cell, the operating temperature of the cell, the operational power supply voltage and the fabrication process parameters, e.g. the materials that are used to create the design in hardware and their associated variances from the ideal targets.

One useful result of a simulator cell characterization is an energy dissipation value. The simulator exercises the cell with a given set of cell parameters over a simulation time period. The energy dissipation value is obtained for each input stimulus and set of cell parameters supplied by the user. By measuring the average current drawn by the cell from the power supply, the energy dissipated in the cell may be determined as described below.

The energy characterization flow is similar to the well understood flow in characterization for timing and propagation delay simulations. However, there are some situations where the timing and propagation characterization flow cannot be used. For example, in timing simulations a cell path is characterized. That is, if an input switches, one or more outputs must also switch as a consequence to obtain a path. In energy characterization, the output(s) may not necessarily switch but energy may still be dissipated within the cell.

For propagation delay measurements, the inputs and outputs may be measured to obtain a delay from the time the input switches to the time the output switches. In energy measurements, the average current measured includes energy stored by the capacitive load external to the cell. This must be removed from the calculation to obtain energy dissipated internal to the cell.

In most timing situations, there is a dichotomy between outputs, i.e., the delay between the switching input and one switching output does not affect the delay between the switching input and another switching output. However, energy is dissipated through the cell based on input switching and not on input/output relationships. The measurement of only one value, i.e. the average current, makes it more difficult to isolate the energy dissipated by one output from that of another since output switching does effect energy dissipation. However, it is necessary, since in the circuit comprising these cells, the outputs may very well be loaded differently and the simulator model must be able to predict the energy dissipated under these conditions.

The steps in energy dissipation characterization in accordance with the present invention are shown in FIG. 1. The following discussion covers the case of characterization of energy dissipation where zero or one output of the cell switches in response to the user supplied input stimulus. To create a simulation, the simulator sets the cell parameters in step 12 of FIG. 1 such as input edge rate, output capacitive load, power supply voltage, operating temperature and process parameters from data supplied by the user. The user also supplies the particular input stimulus that must be characterized. A current measuring device is serially inserted into the simulator description of the cell between the power supply and the cell to measure the average current drawn by the cell over the simulation period.

With the cell parameters and input stimulus set, the simulator exercises the cell over a simulation period in step 14. The average current drawn by the cell block over the simulation period is determined in step 16 by the current measuring device. The simulation period is typically predetermined and depends on the cell parameters.

At this point, the simulator determines whether the output switched in response to the input stimulus. The output switches if the output transitions from logic zero to logic one or vice versa. If the output switched from logic zero to logic one, the output capacitive load charges and the charging rate is greater than zero. In this case, some of the average current measured was diverted from the cell to charge the output capacitive load. The energy diverted to charge the output capacitive load is determined by:

$$E_{DIV} = C_1 \cdot V^2 \qquad (1)$$

where:

$E_{DIV}$ is the energy diverted due to the charge rate;
$C_1$ represents the capacitive load on the output; and
V is the value of the power supply voltage.

If no output switched or if the output switched from a logic one to logic zero, the energy diverted is zero. Step 18 represents the above calculation to determine energy diverted due to charging rate.

The measured power dissipation for the input stimulus and cell parameters is determined by step 20 as shown in equation (2) where:

$$P_{MEAS} = V \cdot I_{AV} \qquad (2)$$

where:

$P_{MEAS}$ is the measured power due to switching;
V is the value of the power supply voltage; and
$I_{AV}$ represents the average current over the simulation period.

The total measured energy, comprising the energy dissipated by the cell itself plus the energy diverted to the output capacitive load, is determined by step 22 as shown in equation (3) where:

$$E_{MEAS} = P_{MEAS} \cdot T \qquad (3)$$

where:

$E_{MEAS}$ is the total energy measured due to switching; and
T is the simulation time period.

Steps 20 and 22 convert the average current to the total energy dissipation due to switching. Equation (3) provides the total energy dissipated in the cell itself and that stored by the output capacitive load if it had a charging rate greater than zero. The next step is to isolate the energy dissipated by the cell itself internally and not due to the output capacitive loading. Step 24 provides the energy dissipated by the cell itself ($E_{CELL}$) by subtracting the energy diverted due to the charge rate ($E_{DIV}$ from equation (1)) from the total energy dissipated due to switching ($E_{MEAS}$ from in equation (3)).

$$E_{CELL} = E_{MEAS} - E_{DIV} \qquad (4)$$

Equation (4) represents the energy dissipated in the cell itself for the given set of cell parameters. By varying the cell parameters for the input stimulus, a table of values may be built which can further be modeled to represent the energy dissipation based on cell parameter(s) dependency. The model for the energy dissipation from the cell parameter(s) dependency includes the calculated data obtained as the table or refined further as a polynomial relationship.

The following discussion covers the steps for characterizing cells with two outputs switching in response to the user supplied input stimulus. The following method is equally applicable to cells having more than two outputs. As in the single output case discussed above, the simulator sets the cell parameters in step 12, e.g. input edge rate, power supply voltage, operating temperature and process parameters from data supplied by the user. The user also supplies the particular input stimulus that must be characterized. A current measuring device is serially inserted into the simulator description of the cell between the power supply and the cell to measure first and second ranges of currents drawn by the cell over the simulation period during first and second series of simulations, respectively.

The capacitive loading at the first and second outputs is performed in two steps which correspond to the first and second series of simulations. The user supplies a range of capacitive load values, including a nominal capacitive load value, over which the capacitive load varies. For the first series of simulations, a first output has its capacitive load varied over the user supplied range in step 14. A second output in the first series of simulations has its value set to the nominal value.

A second series of simulations is also performed in step 14 with the same cell parameters, e.g. input edge rate, power supply voltage, operating temperature and process parameters as the first series of parameters. The capacitive loading scheme is reversed in the second series of simulations. That is, the first output has its value set to the nominal value while the second output has its capacitive load varied over the same user supplied range as used in the first series of simulations.

The first and second series of simulations are performed in the cell over the simulation period in step 14. First and second ranges of currents drawn by the cell block over the simulation period during the first and second series of simulations is determined in step 16 by the current measuring device.

After the simulations are completed, the simulator determines which outputs switch in response to the input stimulus. If any output switches from logic zero to logic one, the output capacitive load charges and the charging rate is greater than zero. In this case, some of the current measured was diverted from the cell to charge the output capacitive load. The energy diverted to charging the output capacitive load is determined by:

$$E_{DIV} = C_1 \cdot V^2 + C_2 \cdot V^2 \qquad (5)$$

where:

$E_{DIV}$ is the energy diverted due to the charge rate;
$C_1$ represents the capacitive load on the first output;
$C_2$ represents the capacitive load on the second output; and
V is the value of the power supply voltage.

Assume in equation (5) that the first and second outputs had charging rates greater than zero. If either the first or second output had not switched or switched from logic one to logic zero, the energy diverted to that particular output would be zero and the associated term(s) would drop out of equation (5). The calculation in equation (5) is repeated for every simulation in both series of simulations. Step 18 represents the above calculation to determine energy diverted due to charging rate on the first and second outputs.

The measured power for the input stimulus and cell parameters is determined by step 20 for every simulation in the first and second series of simulations, see example in equation (2). The total energy dissipated by the cell itself and that stored by the output capacitive load is determined for every simulation in the first and second series of simulations by step 22, see example in equation (3). Steps 20 and 22 convert the first and second ranges of currents to first and second ranges of total energy dissipations due to switching. Equation (5) provides the energy dissipated in the cell itself and that stored by the output capacitive load if it had a charging rate greater than zero. The next step is to isolate the energy dissipated by the cell itself internally and not due to output capacitive loading. Step 24 subtracts the energy diverted due to the charge rate ($E_{DIV}$ from equation (1)) from the total measured energy due to switching ($E_{MEAS}$ from equation (3)).

Figure 2:
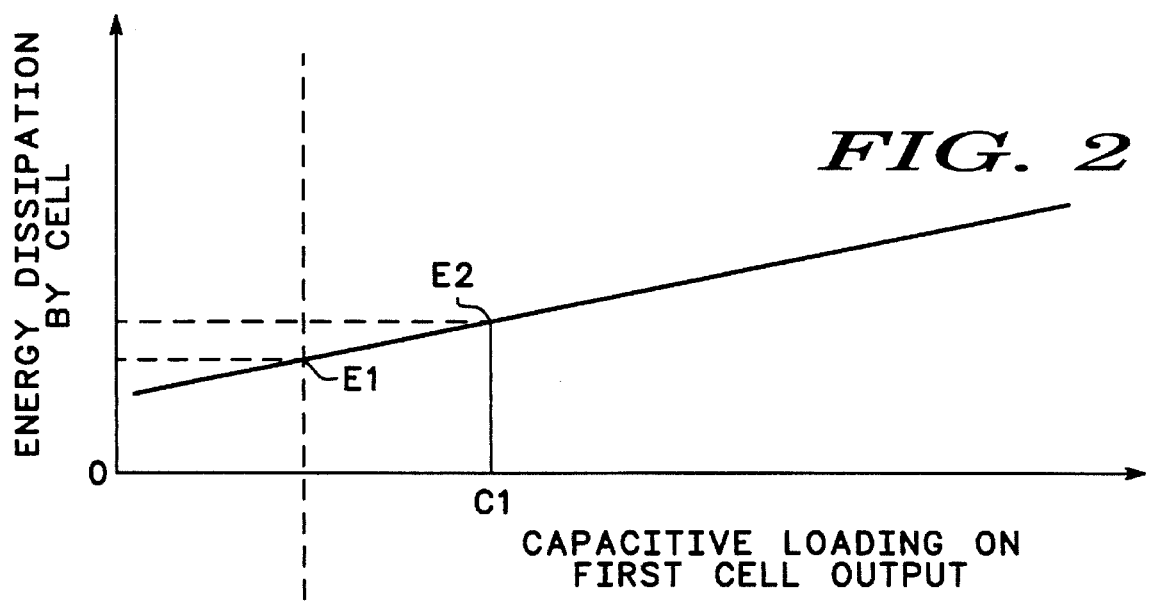
FIGS. 2–4 are plots useful in the explanation of the present invention.
Figure 3:
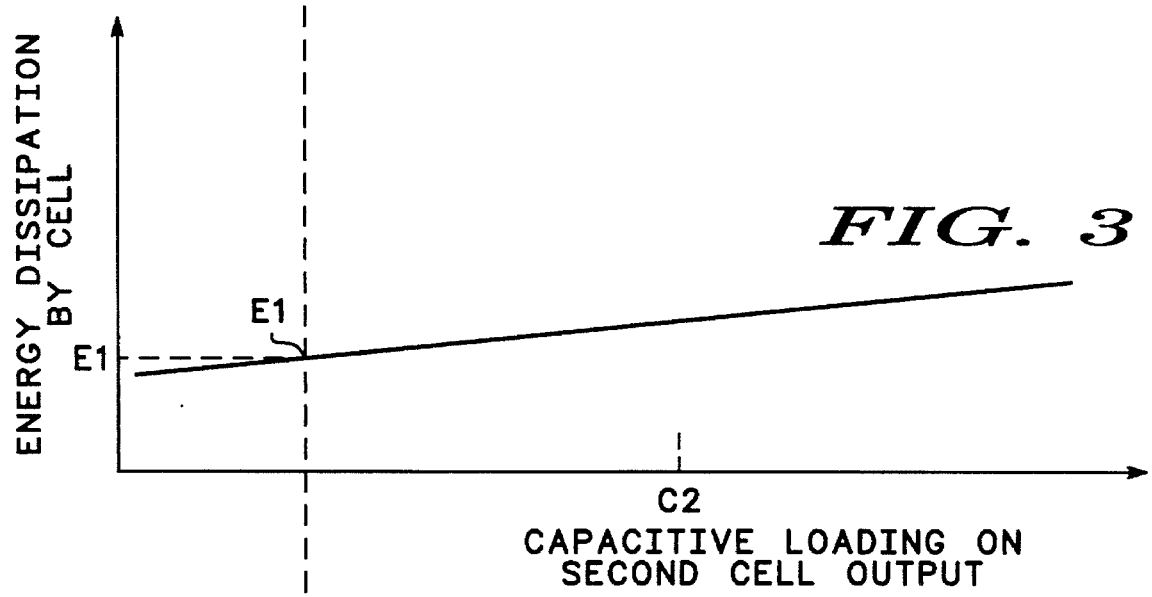

Equation (4) represents the energy dissipated in the cell itself for the given set of cell parameters. The calculation in equation (4) is done on a one-to-one basis, i.e., the calculated energy diverted from one simulation is subtracted from the calculated energy dissipated from the same simulation. This results in two sets of data for the two series of simulations performed. FIG. 2 represents the energy dissipated in the cell when the capacitive loading on the first output is varied while the capacitive loading on the second output is set to the nominal value. FIG. 3 represents the energy dissipated in the cell when the capacitive loading on the second output is varied while the capacitive loading on the first output is set to the nominal value.

Figure 4:
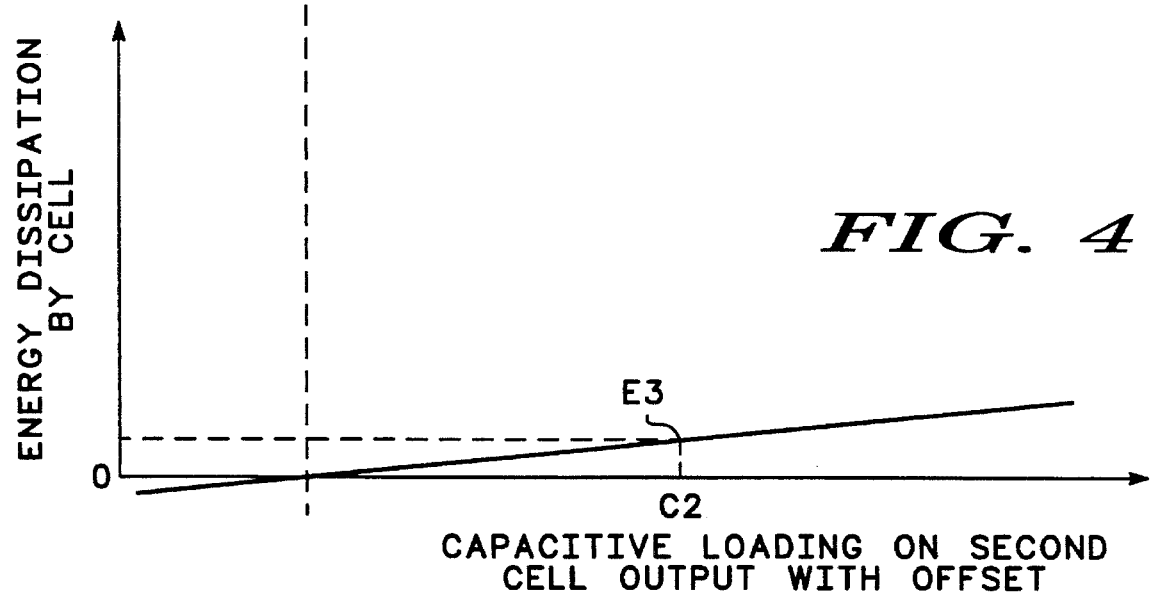

An offset is performed on the data represented in FIG. 3. The offset is the value E1 from FIG. 3. The energy dissipated in the cell when both the first and second outputs are set to the nominal value (point E1 in FIGS. 2 and 3) is subtracted from each data point in FIG. 3 to obtain the offset data represented by FIG. 4. FIG. 2 and FIG. 4 together represent the energy dissipated in cell itself for the given set of cell parameters. For a certain set of output capacitive loads, the energy dissipated is obtained by combining FIGS. 2 and 4. For example, if the first output capacitive load is C1, then the energy dissipated is E2 from FIG. 2. If the second output capacitive load is C2, then energy dissipated is E3 from FIG. 4 including the offset provided by the present invention. The final determination energy dissipated in the cell itself is thus E2+E3.

The present invention performs cell characterization (modeling) for energy dissipation in an automated system. The user supplies a description of the cell, the input stimulus, and cell parameters. The system obtains the model by performing electrical simulations, calculating the energy dissipated internally in the cell by removing the energy diverted to the external output capacitive load(s). For two or more outputs, an offset is performed to obtain a complete model.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A computer implemented method of providing a model of dynamic energy dissipation in a cell, comprising the steps of:
   simulating cell parameters in the cell over a simulation period for determining an average current sunk through the cell and further determining a charging rate of an output of the cell;
   determining dynamic energy diverted due to said charging rate of said output of the cell;
   converting said average current to a total dynamic energy dissipation due to said switching by multiplying said average current by a power supply voltage to the cell; and
   subtracting said dynamic energy diverted due to said charging rate from said total dynamac energy dissipation due to said switching for providing the model of dynamic energy dissipated by the cell.

2. The method of claim 1 wherein said step of converting includes the steps of:
   multiplying a power supply voltage applied to the cell by said average current for determining power dissipation due to switching in the cell; and
   multiplying said power dissipation due to said switching by said simulation period for determining said energy dissipation due to said switching.

3. The method of claim 2 further including the step of setting said cell parameters.

4. The method of claim 3 further including the step of determining said average current drawn by said cell over said simulation period.

5. A computer implemented method of providing a model of dynamic energy dissipation in a cell having first and second outputs, comprising the steps of:
   performing a first plurality of simulations with cell parameters in the cell over a simulation period while varying capacitance on the first output of the cell for providing a first range of currents sunk by the cell and further determining first and second charging rates at the first and second outputs of the cell respectively due to switching in the cell;
   performing a second plurality of simulations of with said cell parameters in the cell while varying capacitance on the second output of the cell for providing a second range of currents sunk by the cell and further determining said first and second charging rates at the first and second outputs of the cell due to said switching;
   determining first and second dynamic energy diverted due to said first and second charging rates of the first and second outputs of the cell under first and second plurality of simulations;
   converting first and second ranges of currents to first and second ranges of dynamic energy dissipations due to switching; and
   subtracting said first and second dynamic energy diverted due to said first and second charging rates from each point of said first and second ranges of energy dissipations due to switching.

6. The method of claim 5 further including the step of subtracting a nominal point of said first range of dynamic energy dissipation from each point of said second range of dynamic energy dissipation for providing said offset range of dynamic energy dissipations as one model of Dynamic energy dissipated by the cell.

7. The method of claim 6 where said step of converting includes the steps of:
   multiplying a power supply voltage applied to the cell by each point of said first and second ranges of currents for determining first and second ranges of power dissipations due to switching; and
   multiplying said first and second power dissipations due to switching by said simulation period for determining said first and second ranges of dynamic energy dissipations.

8. The method of claim 7 further including the step of setting said cell parameters.

9. The method of claim 8 further including the step of determining said first range of currents drawn by said cell over said simulation period.

10. The method of claim 9 further including the step of determining said second range of currents drawn by said cell over said simulation period.

11. A computer implemented method of providing a model of dynamic energy dissipation in a cell having first and second outputs, comprising the steps of:
    performing a first plurality of simulations with cell parameters in the cell over a simulation period while varying capacitance on the first output of the cell for providing a first range of currents sunk by the cell;

determining first and second charging rates at the first and second outputs of the cell respectively due to switching in the cell;

performing a second plurality of simulations of with said cell parameters in the cell while varying capacitance on the second output of the cell for providing a second range of currents sunk by the cell;

determining said first and second charging rates at the first and second outputs of the cell due to said switching;

determining first and second dynamic energy diverted due to said first and second charging rates of the first and second outputs of the cell under first and second plurality of simulations;

multiplying a power supply voltage applied to the cell by each point of said first and second ranges of currents for determining first and second ranges of power dissipations due to switching;

multiplying said first and second power dissipations due to switching by said simulation period for determining first and second ranges of dynamic energy dissipations;

subtracting said first and second dynamic energy dissipations due to said first and second charging rates from each point of said first and second ranges of dynamic energy dissipations due to switching; and subtracting a nominal point of said first range of dynamic energy dissipation from each point of said second range of dynamic energy dissipation for providing said offset range of dynamic energy dissipations as one model of dynamic energy dissipated by the cell.

12. The method of claim 11 further including the step of setting said cell parameters.

13. The method of claim 12 further including the step of determining said first range of currents drawn by said cell over said simulation period.

14. The method of claim 13 further including the step of determining said second range of currents drawn by said cell over said simulation period.

* * * * *